United States Patent
Cullen et al.

(10) Patent No.: US 7,755,347 B1
(45) Date of Patent: Jul. 13, 2010

(54) CURRENT AND VOLTAGE MEASUREMENT DEVICE

(75) Inventors: Gerard L. Cullen, Austin, TX (US); Michael V. Smith, Austin, TX (US)

(73) Assignee: Geist Manufacturing Inc., Lincoln, NE (US)

( * ) Notice: Subject to any disclaimer, the term of this patent is extended or adjusted under 35 U.S.C. 154(b) by 0 days.

(21) Appl. No.: 11/811,691

(22) Filed: Jun. 12, 2007

Related U.S. Application Data

(60) Provisional application No. 60/812,579, filed on Jun. 8, 2006.

(51) Int. Cl.
    *G01R 15/20* (2006.01)
(52) U.S. Cl. .............................. 324/117 H; 324/117 R
(58) Field of Classification Search ............. 324/117 R, 324/117 H, 126, 127
    See application file for complete search history.

(56) References Cited

U.S. PATENT DOCUMENTS

| | | | | |
|---|---|---|---|---|
| 4,625,166 A | * | 11/1986 | Steingroever et al. | 324/223 |
| 5,473,244 A | * | 12/1995 | Libove et al. | 324/126 |
| 5,570,034 A | * | 10/1996 | Needham et al. | 324/763 |
| 5,589,769 A | * | 12/1996 | Krahn | 324/207.26 |
| 6,429,661 B1 | * | 8/2002 | Schweitzer, Jr. | 324/539 |
| 6,441,604 B1 | * | 8/2002 | Gohara et al. | 324/117 R |
| 7,230,414 B2 | * | 6/2007 | Bruno | 324/127 |
| 7,397,233 B2 | * | 7/2008 | Sorensen | 324/76.11 |
| 7,528,593 B2 | * | 5/2009 | Tanizawa | 324/117 H |
| 2003/0020454 A1 | * | 1/2003 | Hauer | 324/117 H |
| 2004/0183522 A1 | * | 9/2004 | Gunn et al. | 324/126 |
| 2005/0156587 A1 | * | 7/2005 | Yakymyshyn et al. | 324/117 R |

* cited by examiner

*Primary Examiner*—Ha Tran T Nguyen
*Assistant Examiner*—Arleen M Vazquez
(74) *Attorney, Agent, or Firm*—Suiter Swantz pc llo

(57) ABSTRACT

The present invention is directed to a current and/or voltage measurement device that allows a user to easily and safely determine current flow by clamping a semi-permanent wrap-around monitor around the power cable without modifying the cable may comprise a plurality of ring-mounted magnetic field sensors which sense magnetic fields produced by the electrical current in the conductors and analysis circuitry for calculating the current in those conductors based on the magnetic field values. In other embodiments, the measurement apparatus may include a plurality of electric field sensors in addition to or in place of the magnetic field sensors, which sense electric fields produced by the electrical current in the conductors which may be used to calculate the voltage in the conductors.

18 Claims, 9 Drawing Sheets

CURRENT AND VOLTAGE MEASUREMENT DEVICE

CROSS-REFERENCE TO RELATED APPLICATION

This application claims priority from Provisional Application Ser. No. 60/812,579 filed on Jun. 8, 2006, which is hereby incorporated by reference in its entirety.

FIELD OF THE INVENTION

The present invention generally relates to the current and voltage measurement devices, and more particularly to an device for measuring current and/or voltage in a power cable that allows a user to easily and safely determine current flow and/or voltage in a power cable without modifying the cable by clamping a semi-permanent wrap-around monitor around the power cable.

BACKGROUND OF THE INVENTION

Many electrical devices, especially computers and related network equipment, use power strips for electric power distribution. In such power strips, if the power consumed exceeds the limit of the circuit breaker, the electrical device will be abruptly disabled to prevent damage to the device. However, in many applications, such as web or e-mail servers, sustained operation is expected. Consequently, it is often desirable to measure the current and/or the voltage consumed by a power strip.

Determining the amount of current being consumed by an individual power strip is not a simple matter. While current can be measured at a power distribution box (e.g., wall-mounted circuit breaker) due to the exposure of individual conductors, the power measured is usually for multiple power strips on a given power circuit and not individual devices. Such a value is not particularly useful when conducting power strip-specific analysis (e.g., determining how many more devices can be plugged into a given power strip before the individual power strip circuit breaker trips).

Current measurements in conductors are commonly accomplished using a current transformer. A current transformer is designed to produce either an alternating current or alternating voltage proportional to the current being measured due to the electromagnetic field generated by the measured current. Referring to FIG. 1, a current transformer 100 common to the art is presented. Current transformers are often constructed by passing a single primary conductor (the primary turn) through a well-insulated toroidal core 101 wrapped with multiple turns of a transformer conductor 102 (the secondary turns). The toroidal core 101 may be composed of ferrous materials such as iron, silicon steel, carbonyl iron or other such materials common in the art. However, such toroidal transformers 100 are not effective for use in pre-existing electrical cables of power strips because the incoming 103 and outgoing 104 electrical currents create opposing magnetic fields which cancel each other.

As such, in order to determine the amount of current in a given conductor of a power strip cable 200 using a wire-wrapped toroidal current transformer 201, a portion of the insulating cable cover 202 must be cut away so a single conductor 203 can be withdrawn from the insulating cover 202 as shown in FIG. 2. The exposed conductor 203 can be cut 204 and a current transformer 201 inserted. For temporary measurements, an electrician's portable ammeter may be used (not shown). Several disadvantages exist with respect to such a method. First, one of the conductors 203 must be exposed. Second, the devices being powered by the power cable 200 should be powered down during addition of the current transformer 201 as a safety precaution, thereby causing undesired system downtime for the devices connected to the power strip.

The most common method used to measure current in an electrical cable requires an electrician to power-off the devices connected to the power strip and temporarily insert a break-out box between the power source (wall or floor receptacle) and the power strip itself. This box exposes the individual conductors so that a clamp-on ammeter can be used to manually measure the current. This method has three drawbacks. First, the equipment has to be powered off before the break-out box can be inserted, again resulting undesirable system downtime, or, alternately, removing the outer insulation on the conductors while the circuit is powered to avoid system downtime, thereby creating a potentially dangerous situation. Second, the value obtained by such manual measurements may quickly become out-of-date as equipment is added or removed from the power strip, thereby requiring repeated measurements.

Consequently, it would be advantageous to provide a current and/or voltage measurement device that allows a user to easily and safely determine current flow and/or voltage in a power cable without modifying a cable by utilizing a semi-permanent wrap-around current and/or voltage monitor.

SUMMARY OF THE INVENTION

Accordingly, the present invention is directed to a current and/or voltage measurement device that allows a user to easily and safely determine current flow by clamping a semi-permanent wrap-around monitor at any position around the power cable without modifying the cable. In embodiments of the invention, the measuring device comprises a plurality of ring-mounted magnetic field sensors which sense magnetic fields produced by the electrical current in the conductors. In other embodiments, the measurement device may include a plurality of electric field sensors in addition to or in place of the magnetic field sensors, which sense electric fields produced by the electrical current in the conductors.

In one specific embodiment, the magnetic field sensors and or electric field sensors are positioned in a clam assembly (similar to a clamp-on cable ammeter) having hinged jaws. The clam assembly is placed around the electrical cable at a convenient cable location for the user, as the clam assembly is non-position dependant. The jaws are shut around the cable attaching the clam assembly around the cable. The clam assembly clamps around all (two or three) conductors including the outer cable insulation. Once attached, the internal circuitry analyzes the magnetic field and/or electric field properties and calculates the current and/or voltage in the conductor.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
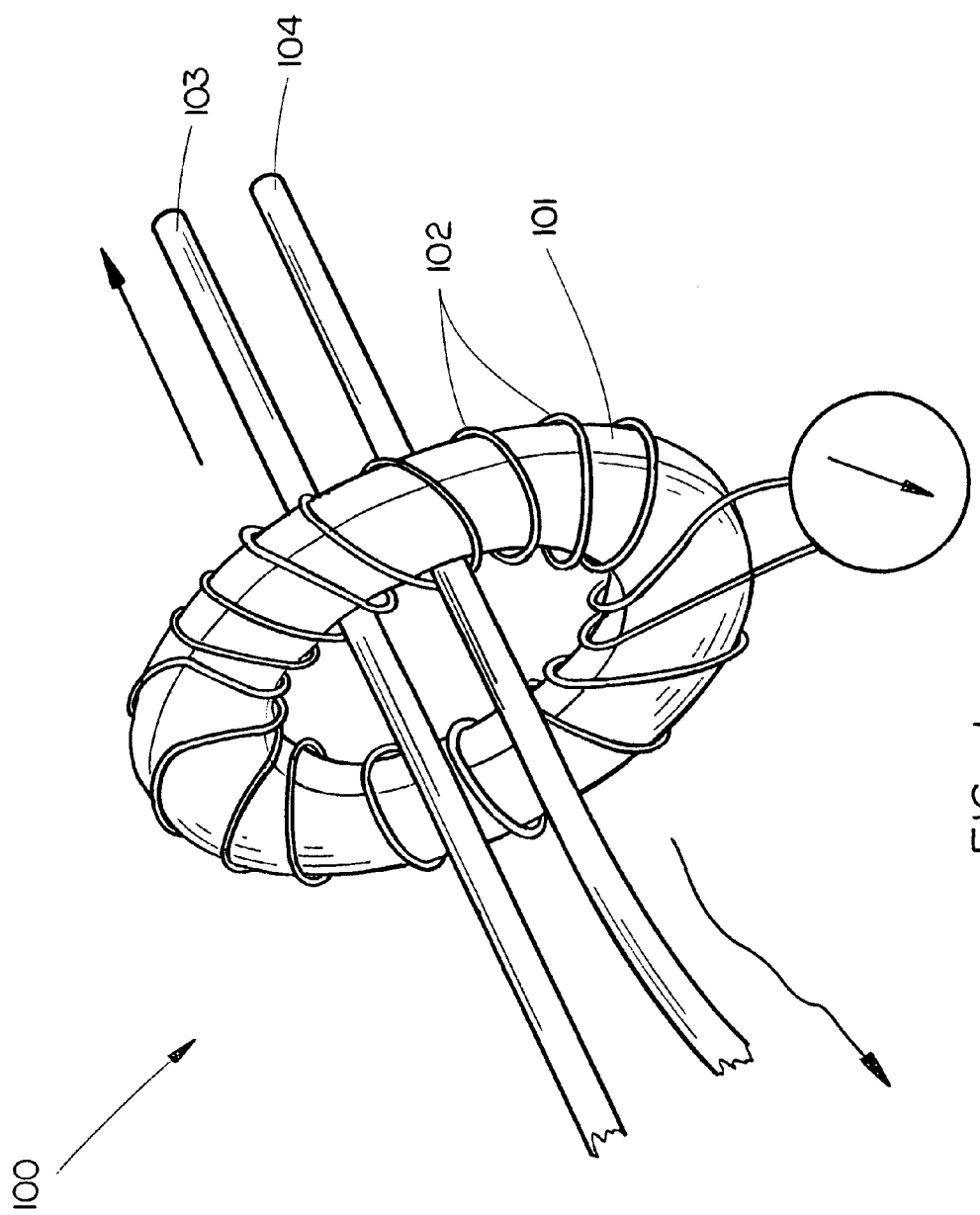
FIG. 1 is an isometric view illustrating an ineffective power measurement device.
Figure 2:
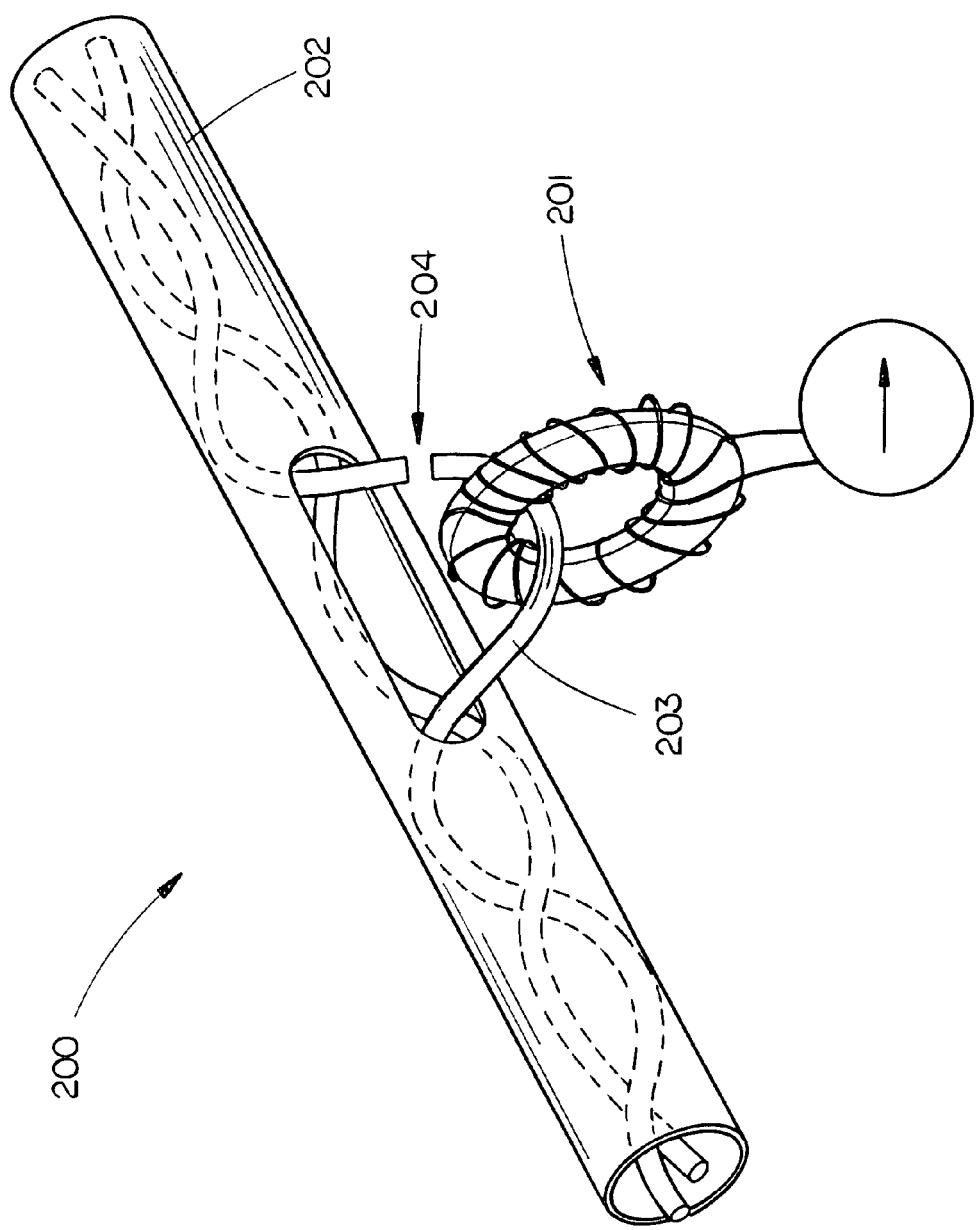
FIG. 2 is an isometric view illustrating an power measurement device.
Figure 3A:
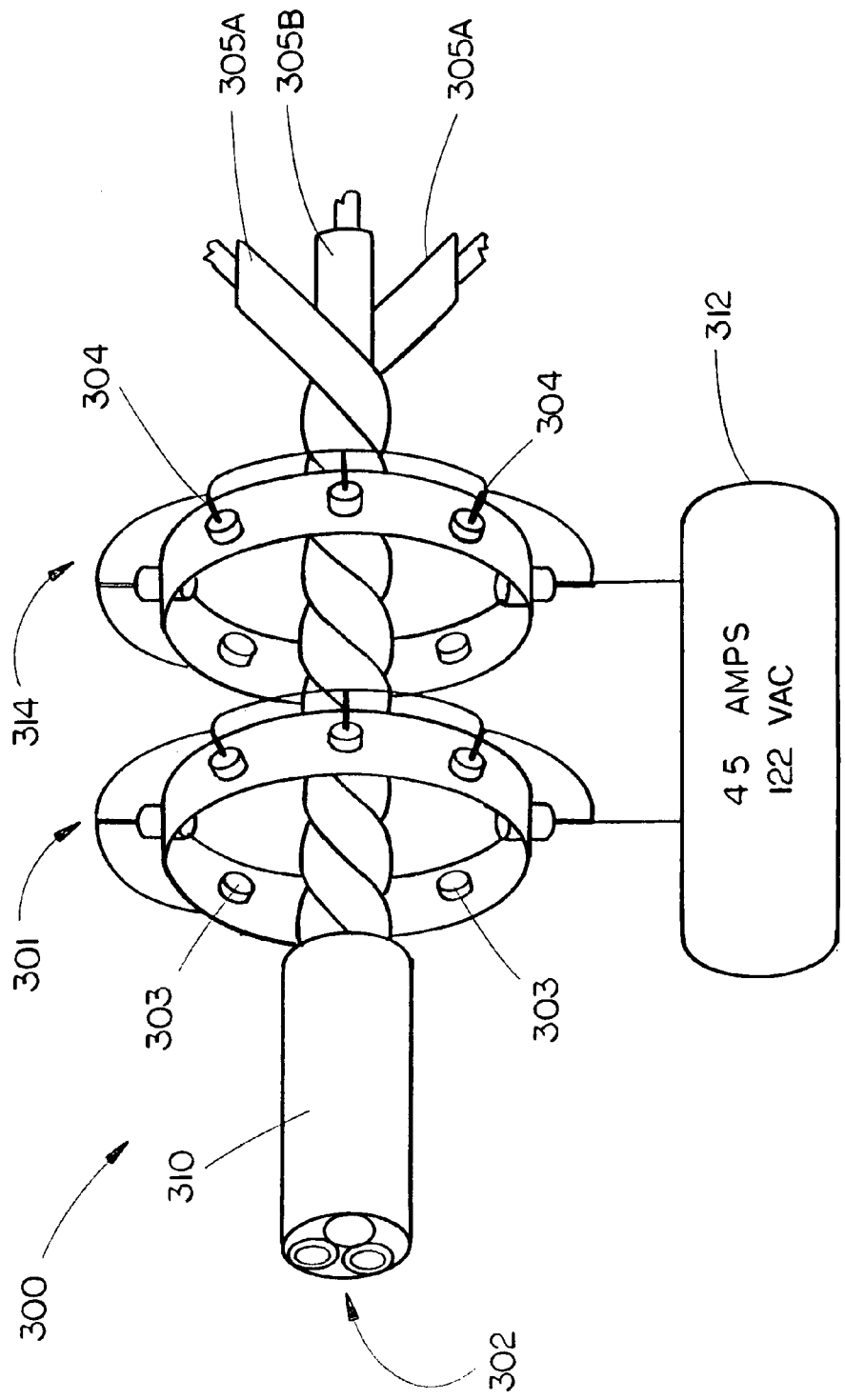
FIG. 3A is an cut-away view illustrating a power measurement device according to an embodiment of the present invention.

FIG. 3A illustrates the operation of a current and/or voltage measuring device 300 in accordance with an exemplary embodiment of the present invention. The measurement device allows a user to easily and safely determine current flow by clamping a semi-permanent wrap-around monitor 301 around a power cable 302 without modifying the cable 302.

In conventional power cable implementations, current carrying conductors 305A and, optionally, a ground conductor 305B within the cable are twisted into a bundle before the outer insulation 310 is applied. As such, the location of either of the current-carrying conductors 305A cannot be determined by visual inspection. Therefore, a primary problem with measuring the current or voltage in such cables is determining the proper position for a magnetic or electric field sensor due to the internal twist of the two or three internal conductors 305.

In embodiments of the invention, the measuring device uses a plurality of ring-mounted magnetic field sensors 303 which sense magnetic fields produced by the electrical current in the conductors. In other embodiments, the measurement device may include an electric field measuring device 314 comprising plurality of electric field sensors 304 (in addition to or in place of the magnetic field sensors 303) which sense electric fields produced by the electrical current in the conductors 305 of the cable 302.

Figure 3B:
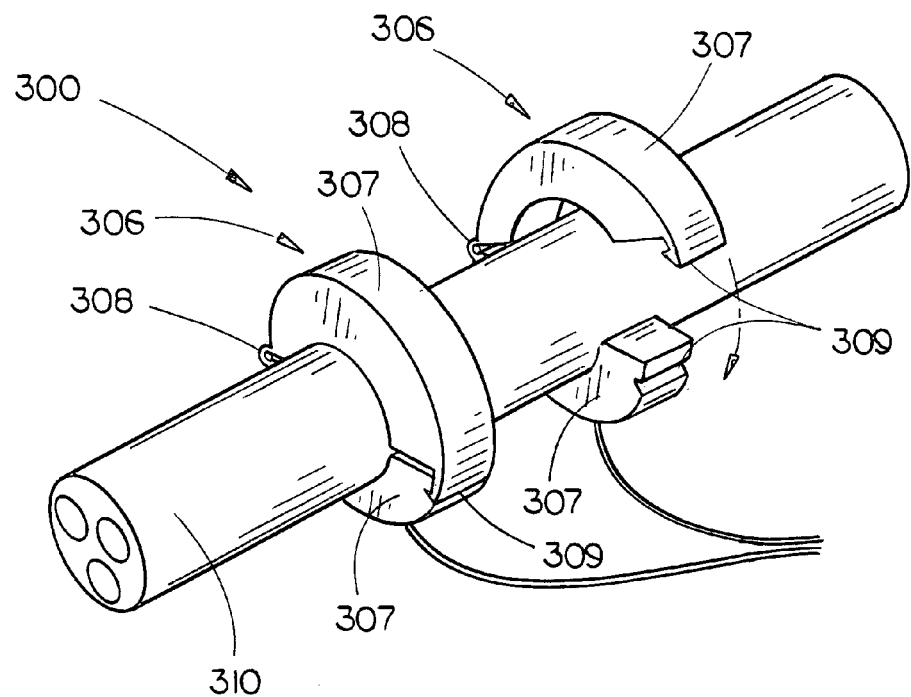
FIG. 3B is an isometric view illustrating a power measurement device according to an embodiment of the present invention.

Referring to FIG. 3B, in one specific embodiment, the current/voltage measuring device 300, the magnetic field sensors 303 and or electric field sensors 304 are positioned about a substrate 306 configured as a clam assembly having multiple jaw portions 307 attached by a hinge means 308. The current/voltage measuring device 300 is placed around the electrical cable at a convenient cable location for the user, as the current/voltage measuring device 300 is non-position dependant. The jaws 307 may be shut around the cable 302 and attached via a fastening mechanism 309, such as a clip, so as to secure the current/voltage measuring device 300 around the cable. The current/voltage measuring device 300 clamps around all (two or three) conductors 305 including the outer cable insulation 310.

Figure 3C:
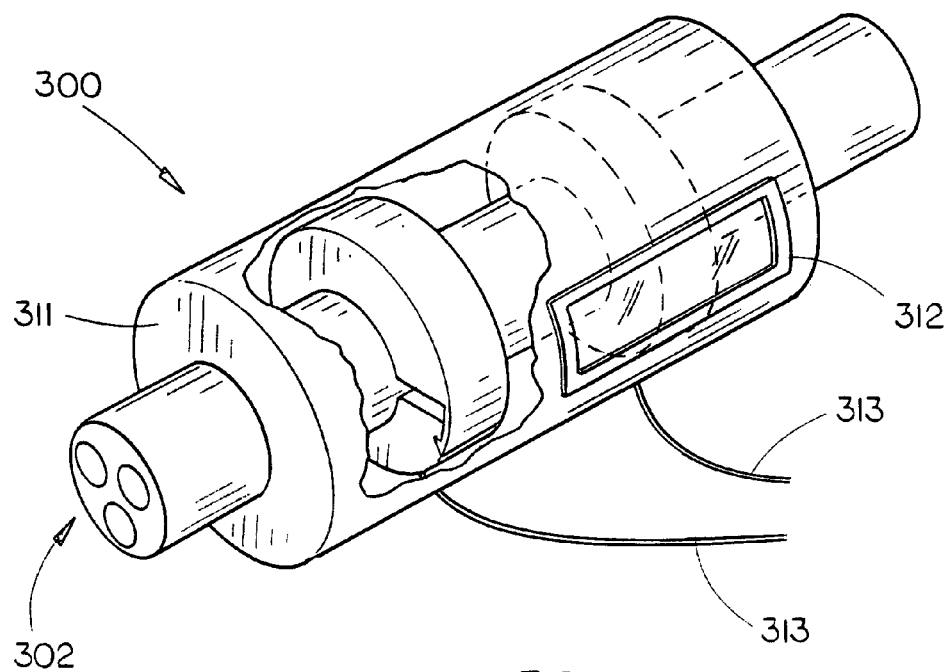
FIG. 3C is an isometric view illustrating a power measurement device according to an embodiment of the present invention.

Referring to FIG. 3C, in a further embodiment, the current/voltage measuring device 300 may be disposed within an external cover 311 so as to further secure the current/voltage measuring device 300 to the cable 302 or to provide a platform for additional functionality such as a display screen 312 for the display of measured values or connections 313 linking the current/voltage measuring device 300 to remote measuring circuitry.

Once attached, internal circuitry of the current/voltage measuring device 300 analyzes the magnetic field and/or electric field properties and calculates the current and/or voltage in the conductor, as will be discussed below.

As previously disclosed, the present invention utilizes a plurality of magnetic or electric field sensors to both detect the location of and measure the current or voltage in a conducting conductor of a power cable. In accordance with the present invention, ring mounted magnetic (and optionally electric) sensors locate the closest conductor and differentiate that signal from the furthest conductor by their magnetic fields. Because of this ability to differentiate amongst signals, the current/voltage measuring device is non-position dependent.

Figure 4A:
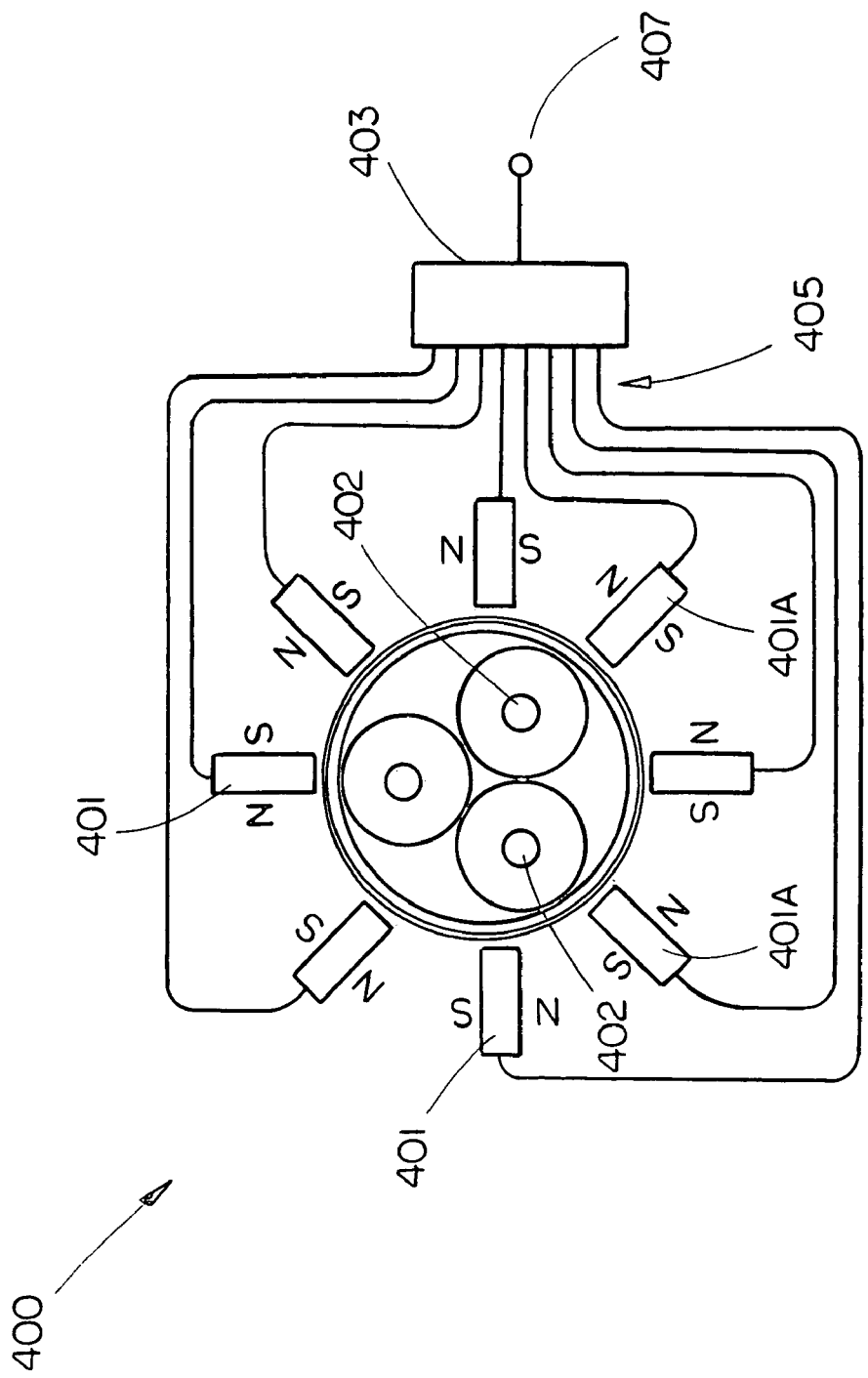
FIG. 4A is a diagrammatic end profile view of two conductors illustrating how magnetic field signals are differentiated in accordance with an exemplary embodiment of the present invention.

Referring to FIG. 4A, in an exemplary embodiment of the present invention, a current measurement device 400 may comprise a plurality of N ring-mounted magnetic field sensors 401. These sensors 401 may be used to differentiate between different field strengths resulting from differing distances from a sensor 401 to a conductor 402. Each of the magnetic field sensors 401 detects magnetic fields produced by the electrical current in the conductors 402. As with other embodiments, this embodiment is non-position dependant, i.e., the user may clamp the assembly to the conductor at a convenient location for the user.

On startup, the device 400 begins scanning the sensors 401 for the sensors 401A nearest to the conductors 402 (i.e. the sensors reading the largest magnetic field signal).

The magnetic field measured by each sensor 401 is compared to the reading of the other sensors 401 by the analysis circuitry 403.

Figure 4B:
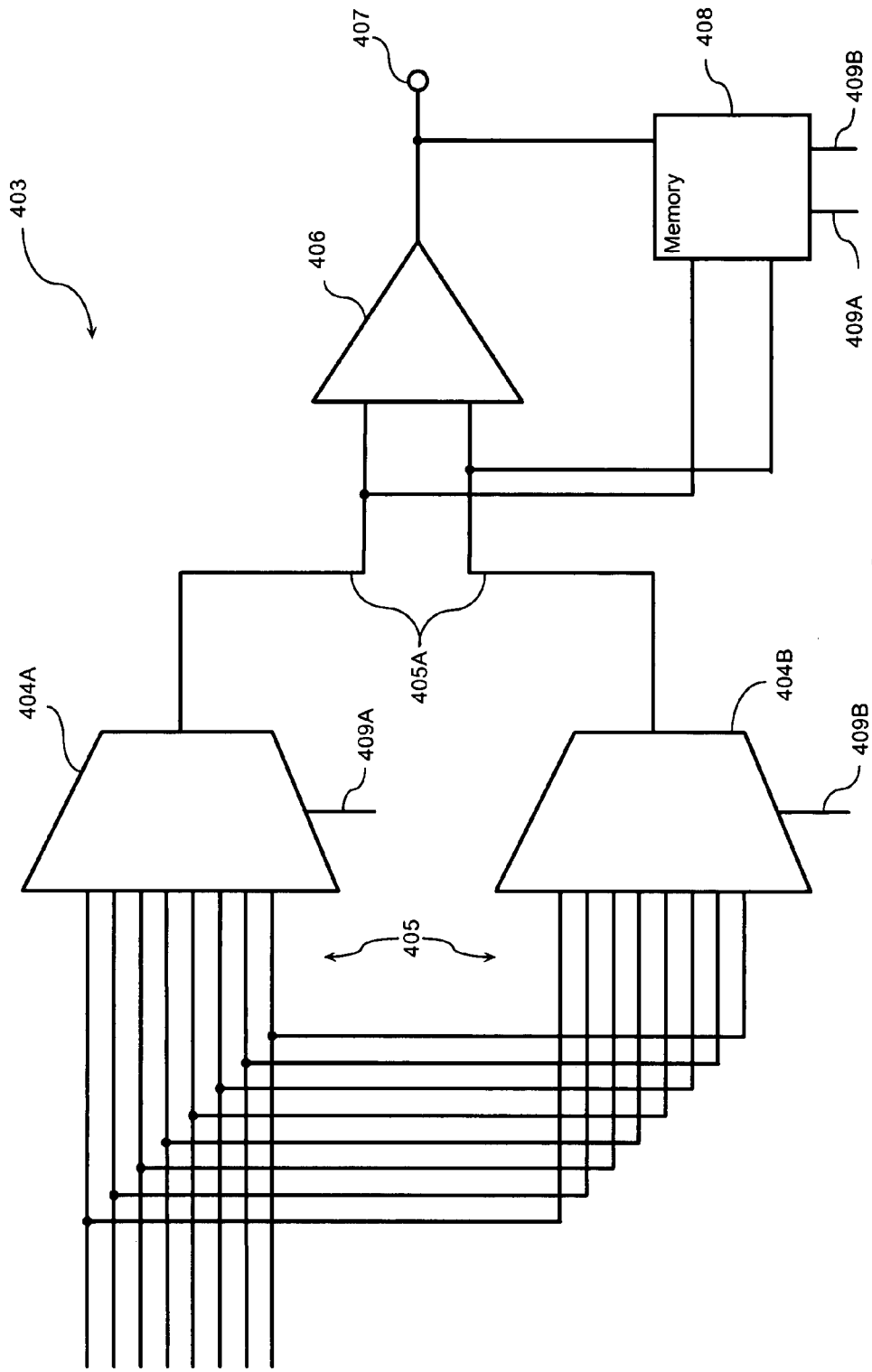
FIG. 4B is a schematic view of conductor proximity analysis circuitry.

Referring to FIG. 4B, the analysis circuitry 403 may comprise two multiplexers 404 having control signals 409 which scan through all combinations of the magnetic field sensor output signals 405 and route them to a differential amplifier 406. The differential amplifier compares the signals in a pair-wise fashion. As the two sensors 401A registering the greatest signal strengths of opposite polarities will be those in closest proximity to the respective conductors 402, the highest valued output 407 from the differential amplifier 406 indicates that the two sensors currently being compared 401A are the two closest to the respective conductors 402. This circuitry configuration allows the current sensor 400 to be physically mounted about the conductors without regard to rotational position.

Once the dominant sensors 401A have been recognized, the analysis circuitry may transmit the control signal values 409 and/or the sensor signal values 405A to a memory element 408 so as to record the identity of the dominant sensors 401A. As such, no re-training of the unit is required if power is lost and subsequently restored. Periodically, the circuitry may 403 verify that it has selected the sensors 401A which provide the highest magnetic field readings. In various embodiments, several types of magnetic field sensors 401 may be used, such as Hall Effect, conductor-wound coils, and the like.

Following identification of the sensors closest to the current carrying conductors, the current flow in those conductors may be determined. As, the magnetic field is proportional to the current flow (pursuant to Gauss' Law), the resulting current may be calculated.

Figure 5:
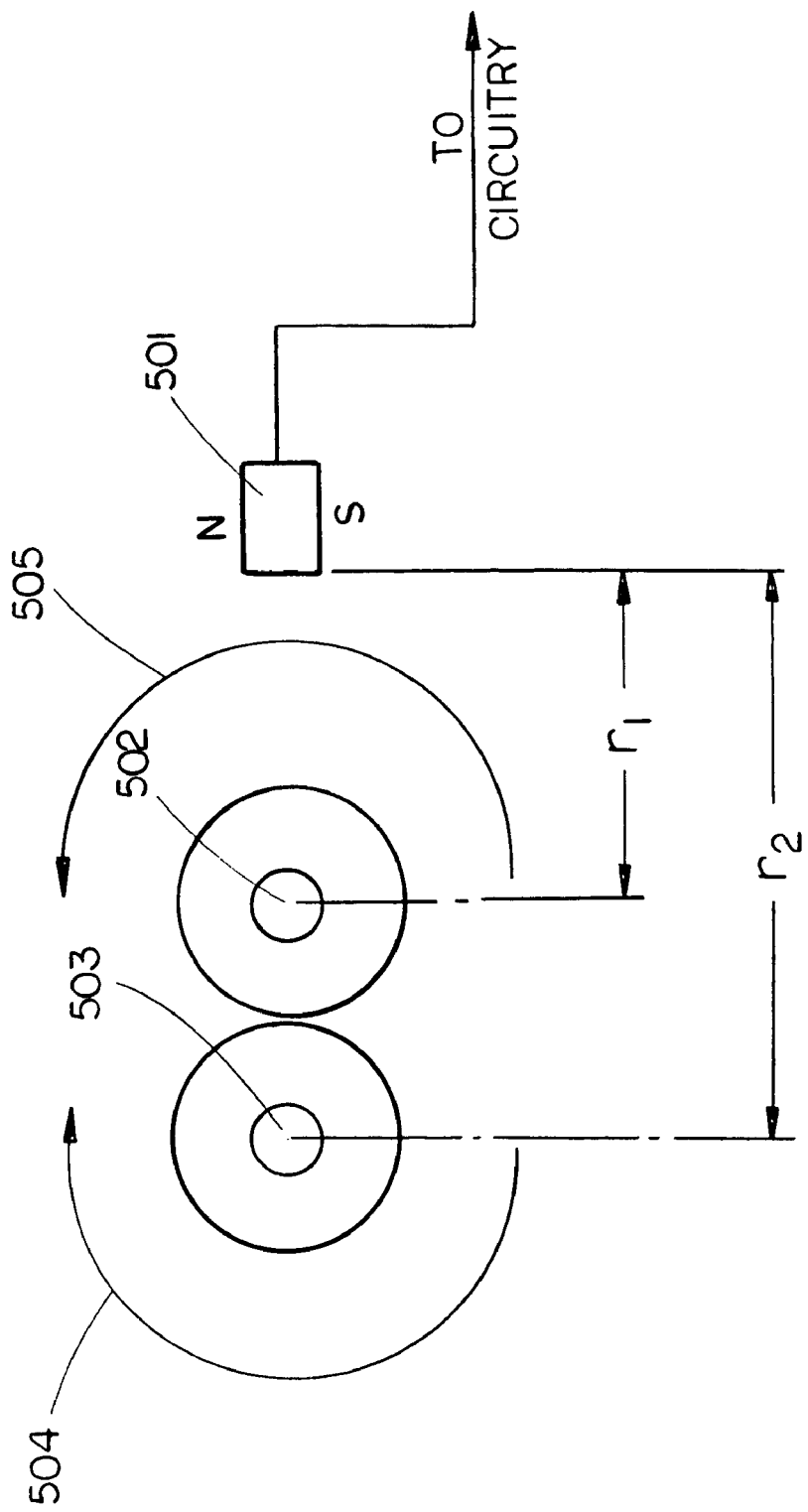
FIG. 5 is a diagrammatic view illustrating the use of multiple magnetic sensors for determining conductor position and current in accordance with the present invention.

Referring to FIG. 5, a magnetic field strength (B) may be measured by a magnetic field sensor 501. A magnetic field is a vector quantity having both amplitude and direction. Its value at a distance r away from a conductor carrying a current I is given by the equation:

$$B = \frac{\mu_0 \cdot I}{2\pi r} \quad \text{(Equation 1)}$$

where $\mu_0 = 4\pi 10^{-7}$ T/A$^2$ is the magnetic permeability of a vacuum. The direction of B is perpendicular to the plane formed by the conductor.

In an exemplary embodiment of the present invention, the point in space where the magnetic field is measured may be the location of the magnetic field sensor 501, at a distance $r_1$ away from current $I_1$ in a first conductor 502 and a distance $r_2$ away from current $I_2$ in a second conductor 503. The difference in distance between the magnetic sensor 501 and the two conductors 502, 503 permits current measurement without physical separating the individual conductors 502, 503 in a power cable. While the physical displacement is small, the physical law gives a linear signal differentiation:

$$B = \frac{\mu_0 \cdot I_1}{2\pi r_1} + \frac{\mu_0 \cdot I_2}{2\pi r_2} \quad \text{(Equation 2)}$$

As current $I_1$ in the first conductor 502 and current $I_2$ in the second conductor 503 have opposite polarities 504, 505 respectively, and assuming $I_1 = -I_2 = I$, the net magnetic field strength at the sensor 501 is yielded by the equation:

$$B = \frac{\mu_0 \cdot I}{2\pi} \cdot \left( \frac{1}{r_1} - \frac{1}{r_2} \right) \quad \text{(Equation 3)}$$

As such, knowledge of the dimensions of the wire components of a cable combined with a measurement of the magnetic field strength yield a simple calculation for computing current flow in a conductor. In many common configurations, wiring dimensions are such that $r_2 \cong 2r_1$. As such, the magnetic field B measured for two parallel wires should be roughly half that of a single wire measured at a distance of $r_1$.

$$B = \frac{\mu_0 \cdot I}{2\pi} \cdot \left( \frac{1}{2 \cdot r_1} \right) \quad \text{(Equation 4)}$$

As such, measurement of B by the sensor closest to a current carrying wire allows for the calculation of that current.

$$I = \frac{B \cdot 4\pi \cdot r_1}{\mu_0} \quad \text{(Equation 5)}$$

Manufacturing the current sensing device to fit specific types of power cable wire gauge allows for the computation of currents with a reasonable degree of accuracy. It may be appreciated that knowledge of the relative spatial relationships between the sensor and the respective conductors will allow for the current calculation in any sized power cable in a like manner.

In an exemplary embodiment of the present invention, microprocessors, such as those developed by Intel™, Texas Instruments™ or other processor manufacturer, are used to perform the calculations. In an alternate exemplary embodiment of the present invention, application specific integrated circuits (ASIC) are used to perform the calculation.

In still a further embodiment, the device could be calibrated to equate measured electrical fields to correspond with a given current flow. If more accuracy is desired, a user may obtain an initial current measurement value using the device which may be stored to memory. The user may then insert a known load (typically 100 watts) into a power outlet connected on the power cable and obtain a second measured value which may be stored to memory. This process may be repeated by incrementally changing the loads so as to obtain a current profile for the power cable. With knowledge of source voltage and current values and the measured current values, the device may be able to automatically calibrate itself to obtain a higher degree of accuracy.

Figure 6:
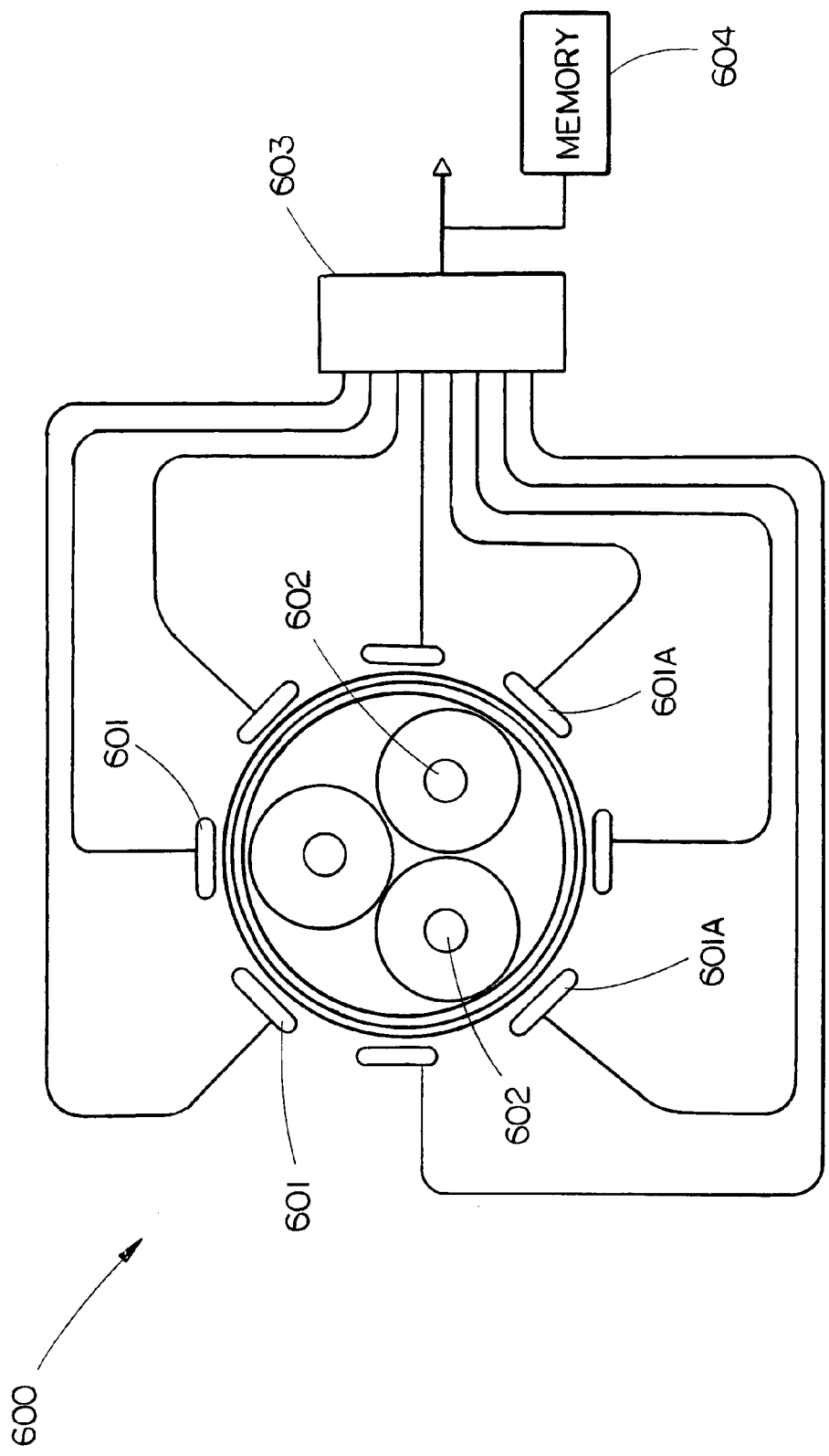
FIG. 6 is a diagrammatic view illustrating the use of multiple electric sensors for determining conductor position and voltage in accordance with the present invention.

Referring to FIG. 6, in a further embodiment, a voltage measurement device 600 may comprise a plurality of electric field sensors 601 (in addition to or in place of the magnetic field sensors 501 of FIG. 5), which sense electric fields produced by the electrical current in the conductors 602. Electric field sensors 601 may be radially-mounted in order to detect voltages in the conductors 602. Analysis circuitry 603 similar to the analysis circuitry 403 presented with respect to the current measurement device 400 may be used to establish which electric field sensors 601A are nearest to the conductors 602.

The electric field measured by each sensor 601 is compared to the reading of the other sensors 601 by the analysis circuitry 603. The analysis circuitry 603 may comprise multiplexers which scan through all combinations of the magnetic field sensor output signals and routes them to a differential amplifier. The differential amplifier 605 compares the signals in a pairwise fashion. As the two sensors 601A registering the greatest signal strengths are in the closest proximity to the respective conductors, the lowest valued output from the differential amplifier indicates that the two sensors currently being compared 601A are the two closest to the respective conductors 602. This configuration allows the voltage measurement device 600 to be physically mounted about the conductors without regard to rotational position.

Again, once the dominant sensor signals 601A have been recognized, the circuitry 603 may transmit the identity of those signals to a non-volatile memory element 604. As such, no re-training of the unit is required if power is lost and subsequently restored. Periodically, the circuitry may 603 verify that it has selected the sensors 601A which provide the highest magnetic field readings. In various embodiments, several types of electric field sensors 601 may be used, such as single-sided capacitive elements and the like.

Figure 7:
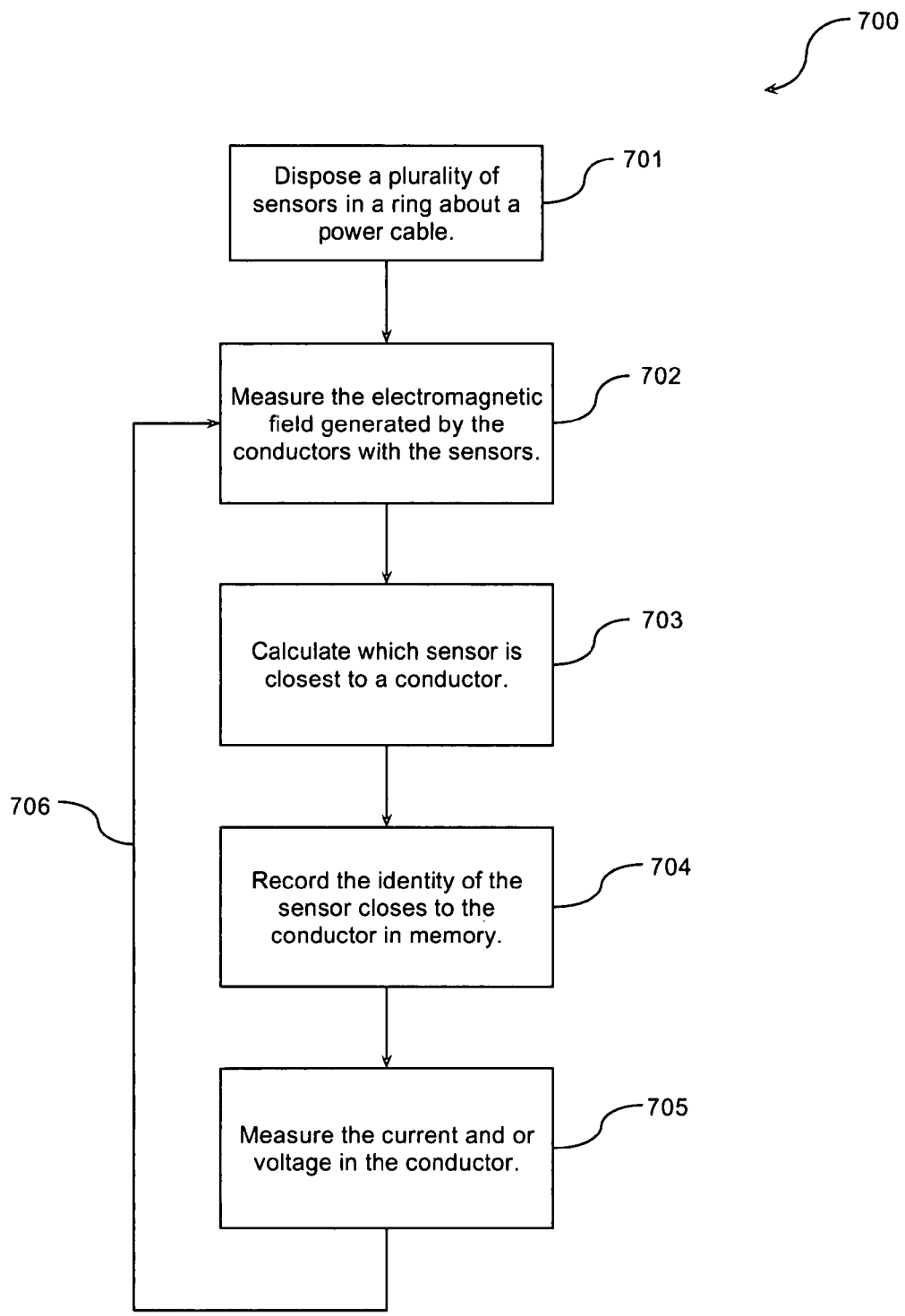
FIG. 7 is a process flowchart detailing a method of current and/or voltage measurement in accordance with the present invention.

Referring to FIG. 7 a method of measuring current and/or voltage in a power cable is presented. A plurality of electromagnetic sensors may be disposed in a ring-shaped configuration at step 701. The electromagnetic sensors may be selected from magnetic field sensors for current calculation or electric field sensors for voltage calculation. The electromagnetic sensors may be affixed to a substrate having a clam-assembly structure comprising a plurality of jaw portions which may be fastened around a current carrying cable.

The electromagnetic field generated by the current carrying conductors of the cable may be measured by the electromagnetic sensors at step 702. The measurements may be made progressively in a scanning pattern or simultaneously by the plurality of electromagnetic sensors. The electromagnetic field measurements may then be transmitted to analysis circuitry where further calculations incorporating those measurements may occur.

The identity of the sensor closest to a particular current carrying conductor may be ascertained at step 703. As previously presented, the sensors and analysis circuitry may be used to determine which current carrying conductor is closest to a sensor pursuant to Equations 2-4 (i.e. the sensor detecting the greatest magnetic or electric field). The acquired electromagnetic signal signature may be stored in non-volatile memory at step 704. As such, no recalibration of the measuring device is required if power to the device is interrupted.

The current or voltage in the current carrying conductors may be calculated at step 705. With knowledge of the electromagnetic field measurements obtained at step 702, the analysis circuitry may calculate the current or voltage of the current carrying conductor pursuant to Equations 2-4.

The measurement device may be configured to periodically recalibrate at step 706 to confirm that the electromagnetic measurements are being read from the sensor detecting the greatest electromagnetic field.

The previously described embodiments of the present invention have many advantages, including providing a simple method to install a sensor network without tools. The clam-assembly configuration is non-position dependant, allowing the user to place the measurement device around a conductor at the location most convenient for the user without disturbing the device's functionality. The circuitry effectively provides signal strength analysis and current computations by recognizing the dominant signal, remembering that selection, and calculating the current value. No penetration of the conductor insulation, the cumbersome previous practice, need occur. The sensor can quickly and efficiently be removed and used on another cable.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the applicant to encompass and include such changes.

What is claimed is:

1. A method for measuring electrical properties of a cable, the method comprising the steps:
   disposing a plurality of magnetic field sensors about a plurality of current carrying conductors;
   measuring a resultant magnetic field generated by the plurality of current carrying conductors with each magnetic field sensor;
   determining a magnetic field sensor pair having a greatest magnetic field measurement differential;
   determining a current in a conductor of the plurality of current carrying conductors using only a magnetic field sensor of the magnetic field sensor pair having a greatest magnetic field measurement differential.

2. The method of claim 1, further comprising the step:
   recording an identity of at least one magnetic sensor of the magnetic sensor pair having the greatest magnetic field measurement differential in a memory element.

3. The method of claim 1, wherein the step of disposing a plurality of magnetic field sensors about a plurality of current carrying conductors further comprises:
   disposing the plurality of magnetic field sensors about a ring-shaped substrate.

4. The method of claim 3,
   wherein the ring-shaped substrate comprises a clam-type assembly having separable jaws.

5. The method of claim 1, further comprising the steps:
   disposing a plurality of electric field sensors about a plurality of current carrying conductors;
   measuring a resultant electric field generated by the current carrying conductors with each electric field sensor;
   determining an electric field sensor pair having a greatest electric field measurement differential;
   determining a voltage in a conductor of the plurality of current carrying conductors using only an electric field sensor of the electric field sensor pair having a greatest electric field measurement differential.

6. The method of claim 5, further comprising the step:
   recording an identity of at least one electric field sensor of the electric field sensor pair having the greatest electric field measurement differential in a memory element.

7. The method of claim 5, wherein the step of disposing a plurality of magnetic field sensors about a plurality of current carrying conductors further comprises:
   disposing the plurality of magnetic field sensors about a ring-shaped substrate.

8. The method of claim 7, wherein the ring-shaped substrate comprises a clam-type assembly having a separable jaws.

9. The method of claim 1, wherein the determining a magnetic field sensor pair having a greatest magnetic field measurement differential comprises:
   comparing magnetic field measurements of the magnetic field sensors in a pairwise fashion with one or more multiplexers to determine a magnetic field sensor pair having a greatest magnetic field measurement differential.

10. The method of claim 1, wherein the plurality of current carrying conductors comprise:
    a twisted bundle of current carrying conductors.

11. An apparatus for measuring electrical properties of a cable, the apparatus comprising:
    means for measuring a resultant magnetic field generated by the plurality of current carrying conductors with a plurality of magnetic field sensors;
    means for determining a magnetic field sensor pair having the greatest magnetic field measurement differential;
    means for determining a current in a conductor of the plurality of conductors using only a magnetic field sensor of the magnetic field sensor pair having a greatest magnetic field measurement differential.

12. The apparatus of claim 11, further comprising:
    recording means for recording an identity of at least one magnetic field sensor of the magnetic field sensor pair having the greatest magnetic field measurement differential in a memory element.

13. The apparatus of claim 11, further comprising:
means for measuring an electric field generated by the current carrying conductors with a plurality of electric field sensors;
means for determining an electric field sensor pair having the greatest electric field measurement differential;
means for determining a voltage in a conductor of the plurality of conductors using only an electric field sensor of the electric field sensor pair having a greatest electric field measurement differential.

14. The apparatus of claim 13, further comprising:
means for recording an identity of an electric field sensor of the electric field sensor pair having the greatest magnetic field measurement in a memory element.

15. The method of claim 11, wherein the means for determining a magnetic field sensor pair having a greatest magnetic field measurement differential comprises:
means for comparing magnetic field measurements of the magnetic field sensors in a pairwise fashion with one or more multiplexers to determine a magnetic field sensor pair having a greatest magnetic field measurement differential.

16. The method of claim 11, wherein the plurality of current carrying conductors comprise:
a twisted bundle of current carrying conductors.

17. A method for measuring electrical properties of a cable, the method comprising:
measuring an electric field generated by a plurality of current carrying conductors with a plurality of electric field sensors;
determining an electric field sensor pair having a greatest electric field measurement differential;
determining a voltage in a conductor of the plurality of conductors using only an electric field sensor of the electric field sensor pair having a greatest electric field measurement differential.

18. The method of claim 17, wherein the determining an electric field sensor pair having a greatest electric field measurement differential comprises:
comparing magnetic field measurements of the electric field sensors in a pairwise fashion with one or more multiplexers to determine an electric field sensor pair having a greatest electric field measurement differential.

* * * * *